United States Patent
Hoenigschmid et al.

(10) Patent No.: US 6,236,258 B1
(45) Date of Patent: *May 22, 2001

(54) WORDLINE DRIVER CIRCUIT USING RING-SHAPED DEVICES

(75) Inventors: Heinz Hoenigschmid, Starnberg (DE); Dmitry Netis, Wappingers Falls, NY (US)

(73) Assignees: International Business Machines Corporation, Armonk, NY (US); Siemens Microelectronics, Inc., Cupertino, CA (US); Siemens Aktiengebellschaft, Munich (DE); Siemens Dram Semiconductor Corporation, San Jose, CA (US); SMI Holding LLC, San Jose, CA (US); Infereon Technologies Corporation Intellectual Property Department, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,514

(22) Filed: Aug. 25, 1998

(51) Int. Cl.[7] .................................................... H03K 3/01
(52) U.S. Cl. ............................................................ 327/534
(58) Field of Search ...................................... 327/434, 534, 327/535, 537, 538; 326/86, 83, 90; 365/185.23; 257/170, 204, 262

(56) References Cited

U.S. PATENT DOCUMENTS

| | | | |
|---|---|---|---|
| 4,287,526 | * 9/1981 | Sakuma | 357/23 |
| 4,298,962 | * 11/1981 | Hamano et al. | 365/182 |
| 4,700,328 | 10/1987 | Burghard | 365/51 |
| 4,845,539 | * 7/1989 | Inoue | 357/23.6 |
| 5,231,590 | 7/1993 | Kumar et al. | 364/491 |
| 5,288,653 | * 2/1994 | Enjoh | 437/41 |
| 5,477,467 | 12/1995 | Rugg | 364/490 |
| 5,567,553 | 10/1996 | Hsu et al. | 430/5 |

FOREIGN PATENT DOCUMENTS

| | | |
|---|---|---|
| 62-081054 | 4/1987 | (JP) . |
| 01191477 | 8/1989 | (JP) . |
| 03239363 | 10/1991 | (JP) . |

* cited by examiner

Primary Examiner—My-Trang Nuton
(74) Attorney, Agent, or Firm—Daryl K. Neff

(57) ABSTRACT

An arrangement of enhanced drivability transistors is disclosed herein which includes a plurality of conductor patterns, wherein the conductor patterns include ring-shaped portions which enclose device diffusion contacts and the ring-shaped portions form the gate conductors of insulated gate field effect transistors (IGFETs).

9 Claims, 5 Drawing Sheets

WORDLINE DRIVER CIRCUIT USING RING-SHAPED DEVICES

FIELD OF THE INVENTION

The present invention relates to semiconductor integrated circuits and more specifically to the layout of semiconductor devices within a semiconductor memory.

BACKGROUND OF THE INVENTION

Two considerations weigh very heavily in the design of semiconductor integrated circuits: operational performance and conservation of area within the integrated circuit (IC) or 'chip'. Many circuit designs that provide outstanding performance must be rejected because of an 'area penalty', i.e. an increase in the layout area on the IC which is required to implement the circuit design. Conversely, circuit designs which offer substantial reductions in IC area are often rejected because of inadequate operating performance. Many of the patented advances in IC circuit design are those in which new paradigms and approaches are introduced in order to satisfy these seemingly conflicting objectives of performance and conservation of area.

Maximization of performance and conservation of IC area weigh very heavily in the design and layout of circuitry for memory ICs, especially dynamic random access memories (DRAMs). Among such circuitry are the wordline driver circuits for a memory. The primary function of a wordline driver circuit is to activate selected memory cells by raising or lowering the voltage on a wordline. A wordline is a conductor which is required to have long length to extend across all or a substantial part of a memory array to provide access to as many as multiple thousands of memory cells. Both the long length of the wordline and its use as the gate conductor for a great number of memory cells result in the wordline having high capacitance. Consequently, the wordline driver circuit must provide large current in order to drive the wordline between signal levels. In each new generation of DRAMs, continued expected increases in the scale of integration will require wordline conductors to extend to proportionally even greater lengths than before and to serve greater numbers of memory cells. Consequently, the increased wordline capacitance will require wordline driver circuits to have even greater device efficiency.

The ever-increasing scale of integration of ICs, especially DRAMs, requires that memory arrays be configured with vast numbers of wordlines, typically multiple thousands of wordlines per array. In addition, the available array of the IC is desirably configured in multiple banking units, each banking unit including a separate memory array, to more efficiently utilize the IC area. A wordline driver circuit must be provided for each of the multiple thousands of wordlines of a memory array. Hence, the area required by the wordline driver circuit can be a critical limitation to the utilization of the IC area. Accordingly, a layout for a wordline driver circuit is needed which provides superior operating performance while occupying less IC area than existing layouts.

To illustrate the background of the present invention, FIG. 1 is a diagram showing the layout of a simple wordline driver which is constructed of an insulated gate field effect transistor (IGFET) 10. With reference to FIG. 1, IGFET 10 includes an active area (AA1) in the semiconductor substrate and a gate conductor 14 which traverses the active area AA1 in the y-direction. On respective sides of the gate conductor 14 are a source (S) and a drain (D).

In order to provide desirably high current throughput through the wordline driver, the width to length ratio (W/L) of IGFET 10 should be high. As is apparent from FIG. 1, the width 12 of the IGFET 10 is the extent of the gate conductor 14 over the active area AA1 in the y-direction (from top to bottom of FIG. 1). The width of the gate conductor 14 determines the effective length ($L_{eff}$) of IGFET 10. Thus, increasing the W/L ratio and the current throughput of the transistor can only be accomplished by decreasing the width of the gate conductor 14 (to decrease $L_{eff}$ of the IGFET 10) or by increasing the active area AA1 of the semiconductor substrate over which the gate conductor 14 extends in the y-direction. As apparent from FIG. 1, the linear layout of IGFET 10 requires an active area AA1 which is relatively long in the y-direction. More efficient utilization of area is needed.

FIG. 2 shows the layout for an IGFET 20 of a "two-fingered" type of wordline driver circuit. In this two-fingered layout, the gate conductor 26 extends, like prongs 22, 24 of a fork, in parallel conductors over the active area AA2. The prongs 22, 24 of the gate conductor 26 operate as a linear gate conductor which has been bent at the middle to traverse the same active area AA at two places. The source regions (S) of the transistor lie to the outside of the prongs 22, 24, while the drain region (D) lies between the prongs 22, 24. In the layout shown in FIG. 2, the extent of the active area AA2 in the y-direction is decreased relative to that of active area AA1 shown in FIG. 1. However, the extent of the active area AA2 in the x-direction is increased relative to that of AA1 (FIG. 1) to accommodate the parallel conductors and parallel source/drain/source arrangement of transistor elements. A still more area-conserving layout for a wordline driver is needed.

FIG. 3 shows a physical contour map for the gate conductors in a wordline driver circuit section of a DRAM IC which precedes the invention, but is not admitted to be prior art. FIG. 3 shows yet another possible design in which a gate conductor 32 of a wordline driver circuit is single-stranded. Each gate conductor 32 is "wiggled", i.e. shifted to one side or another on the substrate surface, in order to conserve IC area while enlarging source and drain contact areas 34, 36 to accommodate the formation of contact studs. The layout shown in FIG. 3 requires an active semiconductor area AA3 which extends less in the x-direction than the layouts shown in FIGS. 1 and 2, but still requires the active area AA3 to be long in the y-direction to accommodate long gate conductors 32.

One disadvantage associated with the layout shown in FIG. 3 is that conductors on the first wiring level (M0) of the IC above the gate conductors must be laid out in a pattern specifically designed to accommodate the "wiggled", i.e. shifting gate conductor patterns therein. Another disadvantage is that the wiggled layout shown in FIG. 3 results in a reduced number of contact points through which current can be supplied or output through source and drain terminals of each wordline driver circuit.

One problem which occurs in the design and layout of wordline driver circuits for each successive generation of DRAM is the nonscalability of channel lengths in p-type IGFET devices (PFETs). For example, with reference to FIG. 1, for a DRAM generation being scaled by 30% from a groundrule of 0.25 um in a first generation (a) to a groundrule of 0.175 um in generation (b), the device length $L_{eff}$ of the PFET, which is 0.45 um in generation (a), can only be scaled by 22% to 0.35 um in the later generation (b). In future generations, the PFET device length may be even less scalable than in this example.

The PFET device length $L_{eff}$ extends in the x-direction which is the direction in which adjacent wordlines of the array are spaced at critical intervals. In prior DRAM generations, a wordline driver layout such as that shown in FIG. 2, the required PFET device length has accommodated a "stagger-4" layout of wordline driver circuits and permitted 1 of 4 decoding. In a stagger-4 layout, groups of four wordline driver circuits are patterned parallel to each other within a given unit of active area extending in the x-direction. In the stagger-4 arrangement, the first group of four wordline driver circuits are "stacked" with a second group of four circuits which are placed adjacent to the first group but at a different location in the y-direction further away from the memory array.

It is desirable to maintain a stagger-4 layout and 1 of 4 decoding because such layout permits the extent of the wordline driver circuit in the y-direction to kept to a minimum. But this is only possible if the width in the x-direction of each group of four wordline driver circuits can be constrained within existing tolerances.

In designing a generation of DRAMs, if the width in the x-direction of wordline driver circuits cannot be constrained within tolerances, then a stagger-8 layout of wordline driver circuits will be required. In a stagger-8 layout, wordline driver circuits are arranged in parallel in groups of two circuits within a given unit of active area in the x-direction. In the stagger-8 arrangement, each group of two wordline driver circuits is "stacked" with second, third and fourth groups of two circuits, wherein each group is placed next to each other but at different locations extending away from the memory array. Consequently, a stagger-8 arrangement doubles the extent of the wordline driver circuits in the y-direction in relation to the stagger-4 arrangement.

As described above, the device length of PFETs cannot be linearly scaled. This leads to a proportional increase, for each successive generation of ICs, in the extent in the x-direction of wordline driver circuits which are constructed with PFETs. Unfortunately, for this reason, an existing layout arrangement such as that shown in FIGS. 2 or 3 would not accommodate a stagger-4 arrangement in DRAM generations smaller than 0.25 um because of the proportionally greater extent in the x-direction of the wordline driver circuits.

Absent the present invention, to be described in the following sections, a stagger-8 arrangement of drivers would be required.

U.S. Pat. No. 5,567,553 to Hsu et al. ("the '553 Patent") describes a two-gate field effect transistor (FET) structure which is designed to have shorter device gate length where the gate conductor overlays the active area of the semiconductor surface than where the gate conductor overlays shallow trench isolation (STI) areas. A phase edge pattern of a mask is used to form resist patterns which result in short device gate length patterns over the active semiconductor area. Opaque patterns are used to form resist patterns which result in long device gate length over the STI regions.

The purpose stated in the '553 Patent for defining gate conductor patterns which vary in device gate length with respect to relative position is to achieve a device threshold voltage Vt which stays the same regardless of the position of the gate conductor over the STI region or the active area. The '553 Patent neither teaches nor suggests defining a series of ring-shaped gate conductor patterns over a continuous area of active semiconductor, having a conductor width which need not vary with position, in order to increase the device gate width without increasing the amount of IC area consumed by a set of adjacent conductor patterns.

Accordingly, it is an object of the invention provide a layout for a wordline driver circuit which reduces the area occupied by the circuit on the IC.

Another object of the invention is to provide a layout for a wordline driver capable of driving increased current on the wordline.

Another object of the invention is to provide a layout for a wordline driver circuit which accommodates increased device length requirements.

Still another object of the invention is to provide a layout for a wordline driver circuit which permits maintaining a stagger-4 arrangement in successive DRAM generations.

SUMMARY OF THE INVENTION

Accordingly, in an embodiment of the present invention, an arrangement of enhanced drivability driver transistors includes a physically uninterrupted, active semiconductor area of a substrate, and a plurality of conductor patterns laid out upon the active semiconductor area, in which each conductor pattern includes one or more ring-shaped portions which enclose device diffusion contact areas, the ring-shaped portions forming gate conductors of insulated gate field effect transistors (IGFETs).

DETAILED DESCRIPTION OF THE PREFERRED EMBODIMENTS

Figure 4:
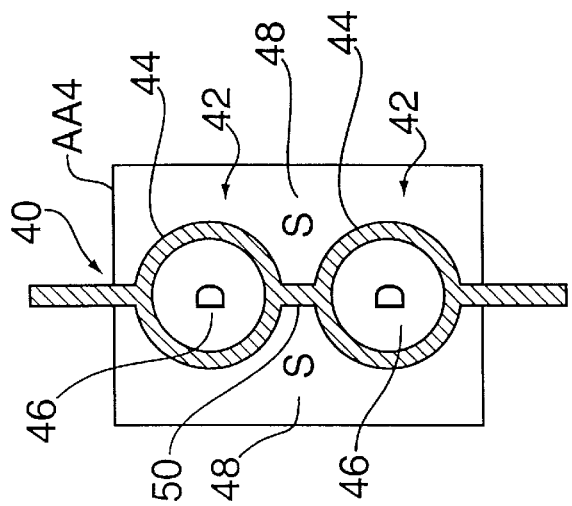
FIG. 4 shows the physical layout of gate conductors in an embodiment of the wordline driver circuit 40 of the present invention.

FIG. 4 shows the physical layout for a first embodiment of the wordline driver circuit 40 of the present invention. As shown in FIG. 4, wordline driver circuit 40 includes a plurality of ring-shaped IGFET devices 42, each of which has a ring-shaped gate conductor 44, a drain region 46 located within the ring-shaped gate conductor 44, and source regions 48 located outside the ring-shaped gate conductor. Between each ring-shaped IGFET device 42 lies a connecting conductor 50 the function of which is to conductively couple the ring-shaped IGFET devices 42. As will be understood, the ring shape of the gate conductor 44 for each transistor 42 results in increased gate conductor length, and hence, increased channel width for the transistor 42.

Figure 5:
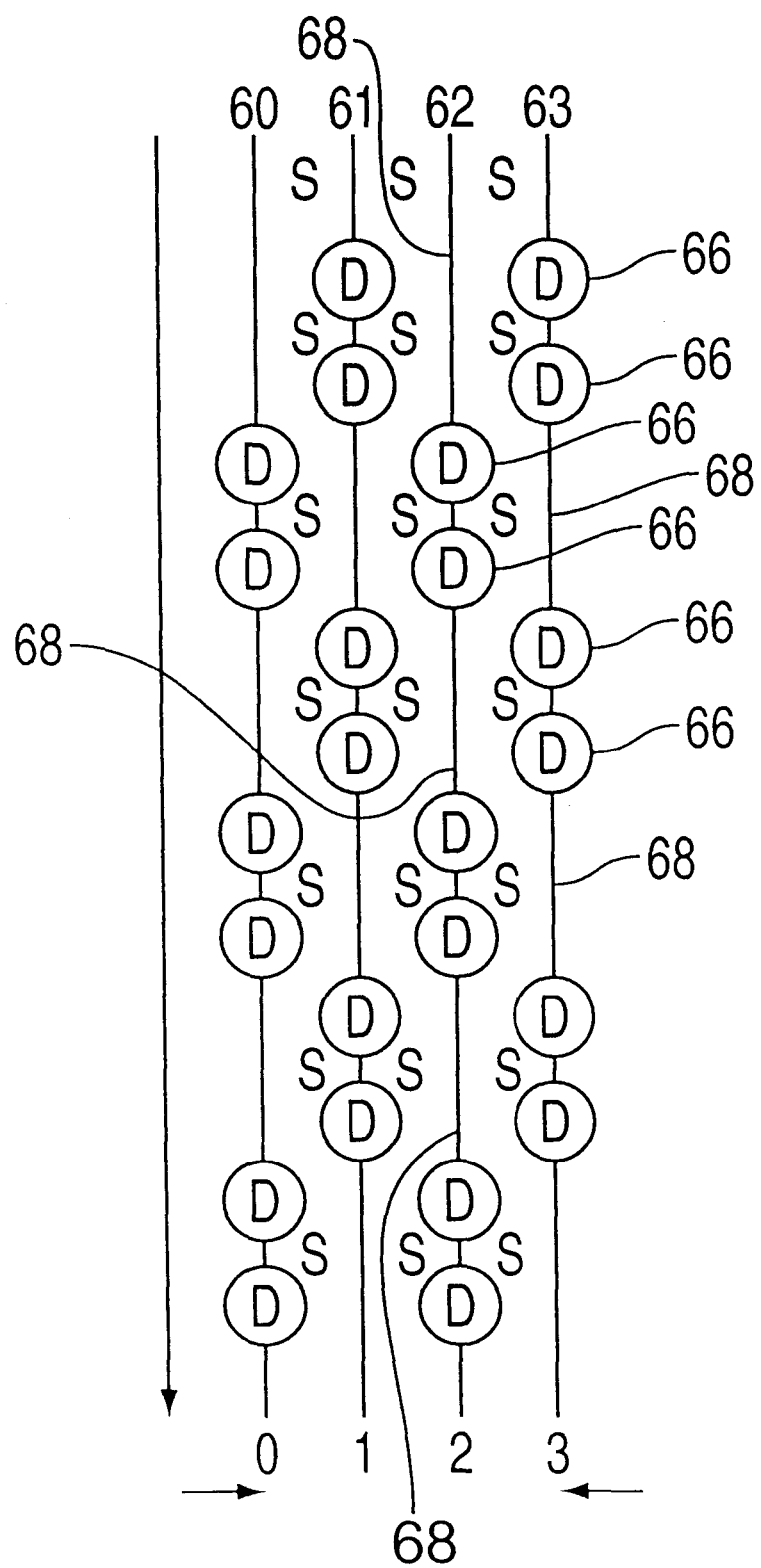
FIG. 5 shows a layout for a region of a memory IC containing a plurality of wordline driver circuits.

With reference to FIG. 5, the application and benefits of the ring-shaped devices disclosed herein will be more fully understood. FIG. 5 is a simplified schematic of a layout for a region of a memory IC which accommodates a plurality of wordline driver circuits. As shown in FIG. 5, adjacent conductors 60, 61, 62, 63 are located close to one another because the ring-shaped gate conductor portions 66 of one conductor, e.g. conductor 63, are offset with respect to ring-shaped gate conductor portions 66 of the adjacent conductors, e.g. conductor 62, such that the ring-shaped conductor portions 66 of one conductor 63 lie immediately adjacent to connecting conductors 68 of another conductor 62. This permits the adjacent conductors 60, 61, 62, 63 to be located closer together than heretofore possible with the prior art two-prong design shown in FIG. 2, while still not violating the groundrule for minimum conductor separation.

Figure 6:
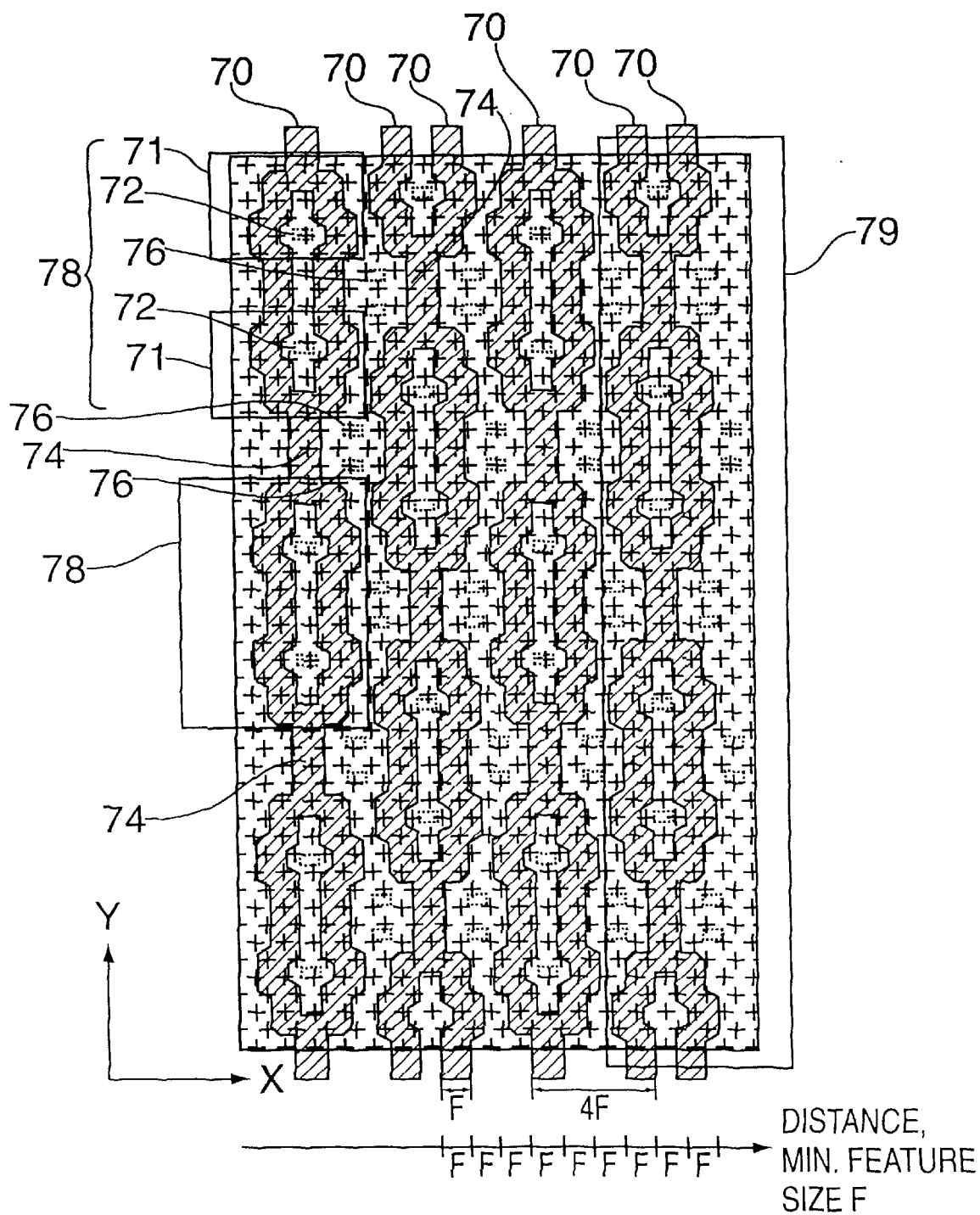
FIG. 6 is a physical contour map showing the layout of an embodiment of the present invention.

FIG. 6 is a physical contour map showing the layout of an embodiment of the present invention. As shown in FIG. 6, conductors 70 include ring-shaped conductor portions 71 which enclose contact points 72 to drain regions located therein. Contact to source regions in the active semiconductor area is made at contact points 76 adjacent to connecting conductors 74. Pairs 78 of ring-shaped conductor portions 72 are joined to other successive pairs of ring-shaped conductor portions 78 by connecting conductors 74.

Figure 2:
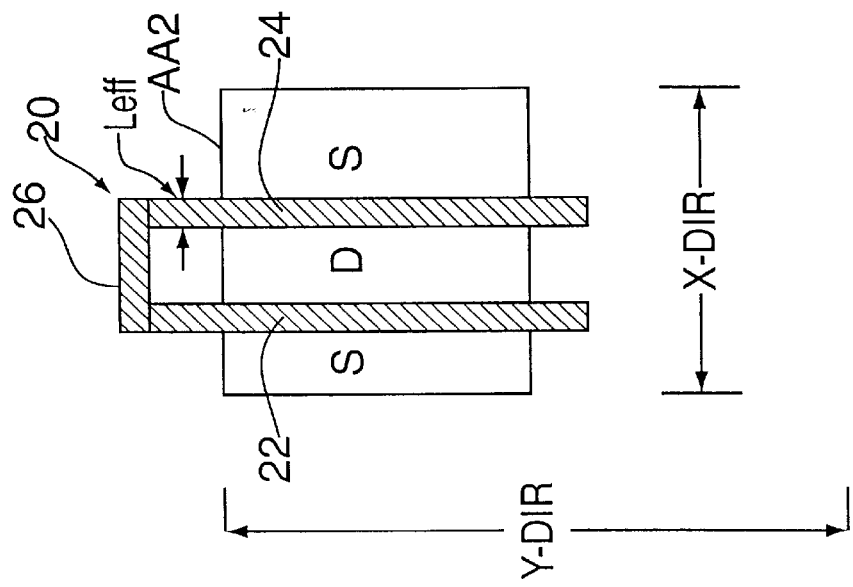
FIG. 2 shows the layout for a wordline driver circuit having "two-fingered" IGFET portions.
Figure 1:
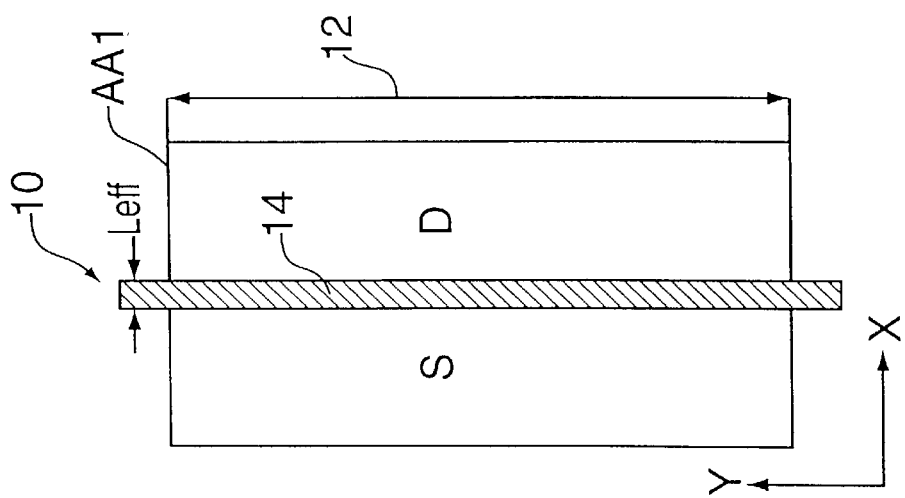
FIG. 1 is a diagram showing the layout of a simple insulated gate field effect transistor (IGFET) 10 which can perform the function of a wordline driver.
Figure 3:
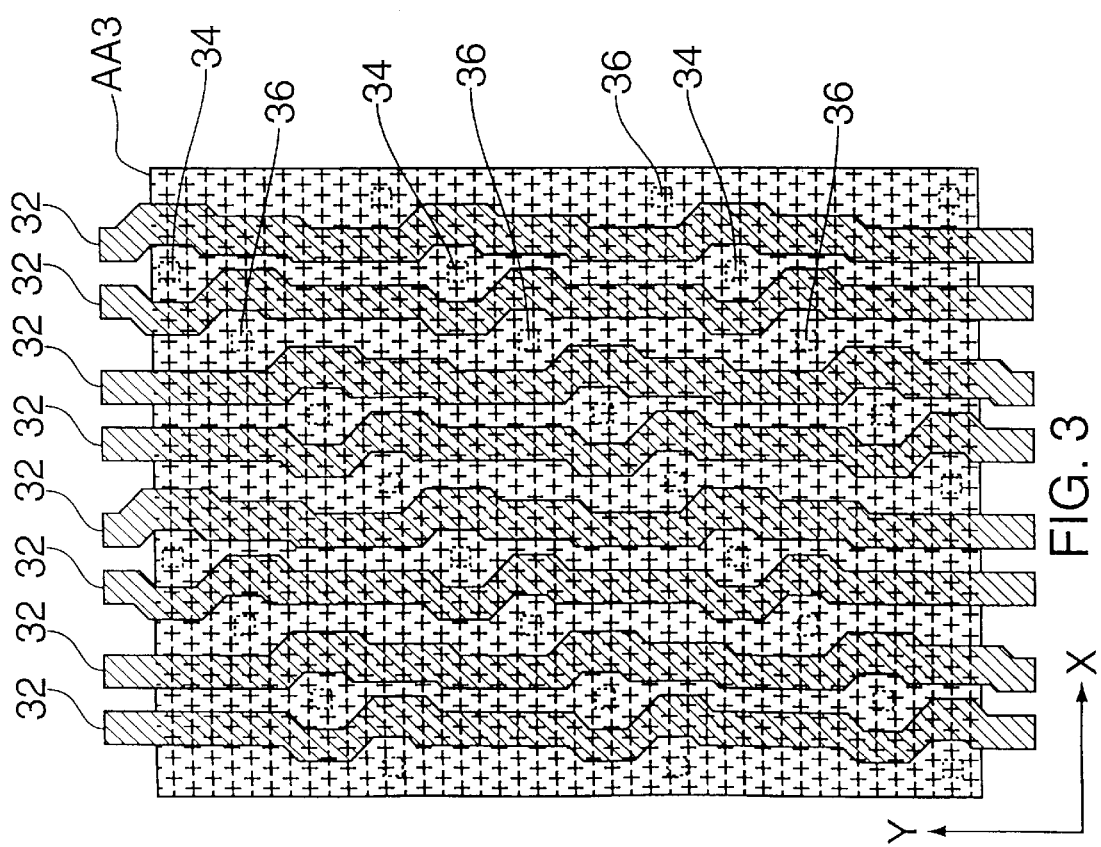
FIG. 3 is a physical contour map showing the layout of gate conductors in a wordline driver circuit section of a DRAM IC which precedes the invention, but which is not admitted to be prior art under any legal definition.

The ring-shaped layout of IGFET devices within each wordline driver circuit results in ring-shaped gate conductor portions 71 having increased length per unit of active area in relation to the layouts shown in FIGS. 1, 2 or 3. The increased length of the gate conductor portions 71 results in increased transistor width W of the IGFETs formed thereby. At the same time, the ring-shaped gate conductors 71 can be patterned to a width which is substantially larger than the groundrule for the DRAM generation to allow for nonscalability of the PFET device length, without increasing the extent of active area required by the wordline driver circuits. In addition, an advantageous transistor width to length (W/L) ratio is maintained which maintains desired current throughput. Also, as will be understood from FIG. 6, adjacent wordline driver conductors 70 remain spaced at a spacing of 4 F which fits with the spacing of M0 wiring level conductors, and permits use of a stagger-4 arrangement of driver circuits.

The increased width of the IGFET devices, resulting from the ring-shaped conductor portions 71, is attained without an increase in the spacing between adjacent conductors (which remains at 4 F). Relative to the layout shown in FIG. 2, the wordline driver circuit shown in FIG. 6 is only incrementally enlarged in the y-direction (due to the presence of connecting conductor portions 74), whereas the extent of the circuit 79 in the x-direction is substantially decreased, thereby permitting the desired stagger-4 arrangement to be maintained in successive generations of ICs. Consequently, the resulting wordline driver circuit 79 has high current output and conserves the active semiconductor area in both x and y directions.

Figure 7A:
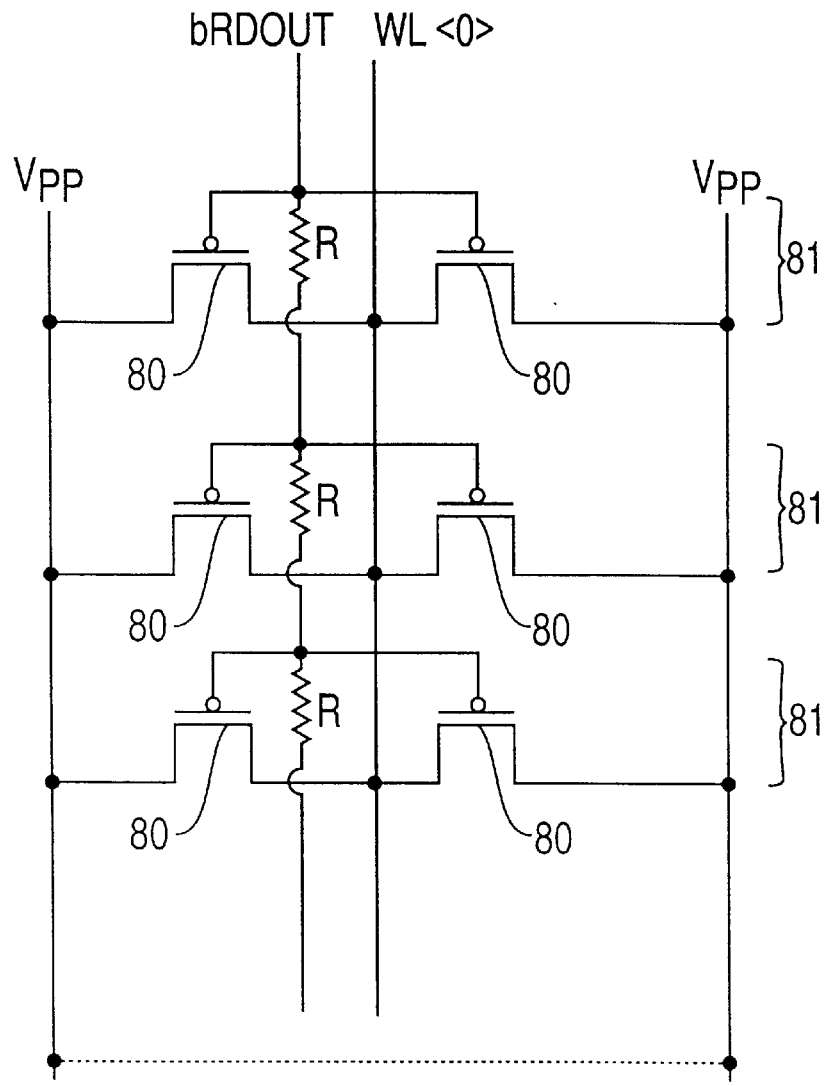
FIGS. 7a and 7b are equivalent circuit schematics for the wordline driver circuit layout shown in FIG. 5
Figure 7B:
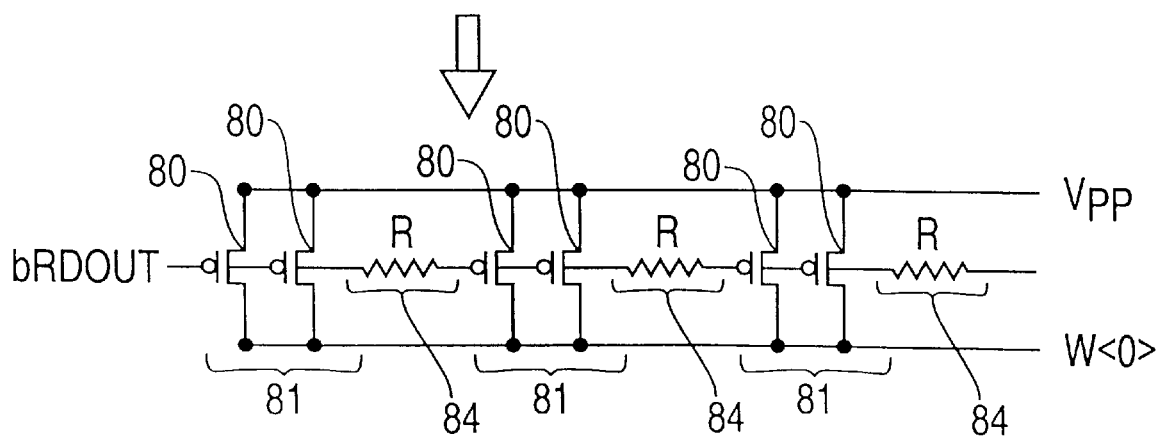

FIGS. 7a and 7b are equivalent circuit schematics for the wordline driver circuit layouts shown in FIGS. 5 and 6. As shown in FIGS. 5 and 6, the ring-shaped conductor IGFETs 80 are arranged in pairs 81. Each IGFET 80 has one terminal (e.g. and preferably the source terminal) tied to a supply voltage Vpp and the other terminal (e.g., preferably the drain terminal) tied to the wordline that is driven by the wordline driver circuit. Between pairs 81 of IGFETs 80 are connecting conductors 84 which, being preferably formed of the same material as the ring-shaped conductor portions, e.g., polysilicon or preferably tungsten silicide, are represented in the schematic by resistances R.

While the invention has been described with reference to certain preferred embodiments thereof, those skilled in the art will recognize the many modifications and enhancements which can be made without departing from the true scope and spirit of the appended claims.

What is claimed is:

1. A parallel connected arrangement of enhanced drivability driver transistors for selectively driving a voltage on a single output line between at least two states, comprising:

a physically uninterrupted, active semiconductor area of a substrate;

a plurality of conductor patterns laid out upon said active semiconductor area, each said conductor pattern including a plurality of ring-shaped portions, said ring-shaped portions forming gate conductors of insulated gate field effect transistors (IGFETs) coupled to receive a selection signal, said ring-shaped portions enclosing drain diffusion contacts connected together in parallel, said IGFETS further including source diffusion contacts to said active area outside said ring-shaped portions, said source diffusion contacts being connected together in parallel, wherein either of said drain diffusion contacts or said source diffusion contacts are conductively coupled to a common potential and the other of said drain diffusion contacts or said source diffusion contacts are conductively coupled to selectively drive a voltage on an output line between at least two states according to the state of said selection signal.

2. The parallel connected arrangement of claim 1 wherein said ring-shaped portions are formed of conductor patterns having width of about one minimum feature size F.

3. The parallel connected arrangement of claim 1 wherein the spacing between adjacent conductor patterns is about 4 F or less.

4. The parallel connected arrangement of claim 1 wherein said plurality of conductor patterns including first and second generally parallel conductor patterns, wherein said ring-shaped portions of said first conductor pattern are formed adjacent to single-stranded portions of said second conductor pattern and ring-shaped portions of said second conductor pattern are formed adjacent to single-stranded portions of said first conductor pattern.

5. The parallel connected arrangement of claim 1 wherein said plurality of ring-shaped portions are interposed between single-stranded portions, said single-stranded portions forming connections between gate connected transistors.

6. A parallel connected arrangement of transistors for providing enhanced current to drive a voltage on a single output line between a first and a second value, comprising:

a physically uninterrupted, active semiconductor area of a substrate;

a plurality of insulated gate field effect transistors (IGFETs) formed by ring-shaped portions of conductor patterns laid out upon said active semiconductor area, said IGFETs having series-connected gate terminals coupled to receive a line selection voltage, parallel connected source terminals lying outside said ring-shaped portions and parallel connected drain terminals lying within said ring-shaped portions, wherein either of said source terminals or said drain terminals are conductively coupled to a common supply voltage and the other of said source terminals or said drain terminals are conductively coupled to said output line to selectively drive a voltage on said output line between first and second values according to the value of said line selection voltage.

7. The parallel connected arrangement of claim 6 wherein said lines comprise wordlines.

8. The parallel connected arrangement of claim 6 wherein said conductor patterns have width W greater than minimum feature size F and said spacing between adjacent conductor patterns is 4 W or less.

9. The parallel connected arrangement of claim 7 wherein said drain terminals are formed within said ring-shaped portions of diffusion contacts to said active semiconductor area.

* * * * *